(12) United States Patent
Walker

(10) Patent No.: US 7,221,723 B2
(45) Date of Patent: May 22, 2007

(54) MULTI-PHASE SAMPLING

(75) Inventor: Richard C. Walker, Palo Alto, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 689 days.

(21) Appl. No.: 09/994,446

(22) Filed: Nov. 27, 2001

(65) Prior Publication Data

US 2003/0123591 A1 Jul. 3, 2003

(51) Int. Cl.
*H04L 7/00* (2006.01)
(52) U.S. Cl. ........................... 375/355; 375/371
(58) Field of Classification Search ............... 375/355, 375/371, 295, 316; 327/291, 91
See application file for complete search history.

(56) References Cited

U.S. PATENT DOCUMENTS

| | | | | |
|---|---|---|---|---|
| 4,333,060 A | * | 6/1982 | Mosley et al. ............... 331/1 A |
| 4,376,309 A | * | 3/1983 | Fenderson et al. .......... 375/348 |
| 4,756,011 A | * | 7/1988 | Cordell ........................ 375/371 |
| 4,773,085 A | * | 9/1988 | Cordell ........................ 375/375 |
| 4,789,996 A | * | 12/1988 | Butcher ....................... 375/376 |
| 4,821,296 A | * | 4/1989 | Cordell ........................ 375/374 |
| 5,239,274 A | * | 8/1993 | Chi ............................... 331/57 |
| 5,247,544 A | * | 9/1993 | LaRosa et al. .............. 375/371 |
| 5,491,729 A | * | 2/1996 | Co et al. ..................... 375/376 |
| 6,266,799 B1 | * | 7/2001 | Lee et al. ........................ 716/6 |
| 6,307,906 B1 | * | 10/2001 | Tanji et al. .................. 375/376 |
| 6,374,361 B1 | * | 4/2002 | Lee et al. ..................... 713/503 |
| 6,438,081 B2 | * | 8/2002 | Jinbo et al. .............. 369/47.28 |
| 6,452,591 B1 | * | 9/2002 | Ho et al. ..................... 345/213 |
| 6,556,640 B1 | * | 4/2003 | Baba .......................... 375/376 |
| 6,624,668 B1 | * | 9/2003 | Robinson et al. ........... 327/103 |
| 6,711,220 B1 | * | 3/2004 | Yoshida et al. ............. 375/354 |
| 6,850,580 B1 | * | 2/2005 | Naoe .......................... 375/355 |
| 6,987,825 B1 | * | 1/2006 | Yoshimura et al. ......... 375/371 |
| 6,996,201 B2 | * | 2/2006 | Arima ......................... 375/355 |

FOREIGN PATENT DOCUMENTS

| EP | 0 758 171 | 2/1997 |
|---|---|---|
| EP | 1 063 809 | 12/2000 |

OTHER PUBLICATIONS

Alexander, J.D.H., "Clock Recovery From Random Binary Signals" Electronics Letters, vol. 11, No. 22, Oct. 30, 1975, pp. 541-542.

* cited by examiner

*Primary Examiner*—Jean B. Corrielus

(57) ABSTRACT

The present invention provides a multi-phase sampling system in which each sampler samples a transition and data of an incoming data signal. By enabling each sampler to sample a transition in addition to data of the incoming data signal, phase errors associated with each of the samplers can be determined. The phase error determinations provide valuable information that can be used 1) to correct the phase errors of the system sampling the incoming data signal, 2) to correct the phase errors of a multi-phase system that is transmitting the incoming data signal, and/or 3) to correct the phase errors of both a multi-phase system that is sampling an incoming data signal and of a multi-phase system that is transmitting the data signal.

28 Claims, 3 Drawing Sheets

MULTI-PHASE SAMPLING

BACKGROUND OF THE INVENTION

The present invention relates to multi-phase sampling. In particular, the present invention provides a multi-phase sampling system that overcomes problems with current multi-phase systems that result from the inability of these multi-phase sampling systems to optimally sample an incoming data signal.

An ever-increasing demand exists for communications systems that are capable of operating at increasingly higher data rates. As monolithic processes (e.g., complementary metal oxide semiconductor (CMOS)) are increasingly being used to create devices that perform high-speed data processing, it has become necessary to use multiple phases in the devices for sampling and processing incoming signals in order to sample the incoming data signals at the Nyquist rate. The need for using multiple samplers in order to sample the data signal at a high enough speed can be seen from the following example. The cycle or retrigger time of a data retiming latch is often limited by the regeneration speed of the internal positive feedback circuitry of the latch. Although such a sampler or latch cannot be retriggered fast enough to Nyquist sample an incoming signal of a particularly high data rate, it is capable of taking a snapshot of a rapidly changing signal. By using a multiplicity of samplers on evenly staggered clock phases, each latch can be allowed a generous regeneration time, while still enabling sampling of the data signal at the Nyquist rate. An example of a known multi-phase system is a 3.5 gigabit per second (Gb/s) retiming circuit for non-return-to-zero (NRZ) data that uses a 10-phase sampling system built in 0.28 micrometer (um) CMOS. Such a system is disclosed in ISSCC Digest of Technical Papers, Vol. 42, pages 352–353 and 478, Feb. 15–17, 1999.

These and similar types of systems share the strategy of processing high-speed incoming signals by using multiple lower-speed samplers that all sample the incoming signal in a round-robin fashion. The samplers are lower in speed because they are comprised of larger transistors, which have larger parasitic capacitances, and thus have longer regeneration times and slower retrigger times. Due to the slower speeds of the large samplers, many samplers may be required in order to sample a very high data rate signal at the Nyquist rate. Also, because the samplers are larger in size, they dissipate more power. Obviously, such systems have many disadvantages that need to be overcome.

Multi-phase systems are also used to transmit data. In these systems, data is transmitted by using multiple phases to control respective selectors, each of which gates a different bit to the output of the transmitting multi-phase system. In this case, the jitter of each data edge is determined by the timing error of each data phase.

For monolithic implementations (e.g., CMOS), it is common to generate the multiple phases using a ring oscillator. The most common form of ring oscillator utilizes a number N of identical gain stages, each with a delay of $\tau$, connected in a ring with a net inversion. As is well known in the art, such a system oscillates with a period of $2N\tau$, and produces 2N evenly-spaced timing phases, with the phases being derived from both the rising and falling edges of each delay cell output. Such oscillators can be made tunable and are well-suited for monolithic IC implementation. However, such systems are designed such that the number of phases is even, i.e., for 2N evenly-spaced phases, where N is an integer.

In practice, the exact delay of oscillator elements will differ between the N different cells. These variations include random cycle-to-cycle delay variations, resulting largely from thermal, supply, and substrate noise in the devices, and deterministic delay errors, which are consistent cycle after cycle. These static delay errors can be caused by a number of factors, including: 1) device size variation due to fabrication errors that occur during the IC fabrication process, 2) non-symmetrical layout of the various delay cells, including capacitance, resistance and inductive mismatches caused by unequal wiring or crosstalk with other signals, 3) unequal proximity of various delay cells to other features which causes variations in doping or dielectric thickness to occur and/or unequal loading of the various delay outputs which can cause mismatched fan-out delays.

In addition, these same delay variations can afflict the clock distribution network. Because of its distributed nature, the clock network may also suffer from delay mismatches due to unequal supply voltages caused by resistive drops across the power distribution network. Also, it is possible for variations in the clock-to-sample delay between the input samplers to occur. The sum of all these errors results in an overall phase sampling error in the system.

One known way of preventing or reducing these phase errors is to decrease the aforementioned error factors 1)–3). However, solutions for doing this are difficult to implement and, thus far, have not been totally satisfactory. Furthermore, implementing these solutions typically result in increases in power dissipation and circuit size, and/or place an onerous burden on the designer to create precisely symmetrical samplers. Furthermore, such solutions must be implemented during device design and fabrication, not after the device has already been created. Therefore, failure to satisfactorily implement the solutions during the design and manufacturing process will likely result in phase error sampling problems occurring during operation of the device.

Another approach that has been used to eliminate phase error sampling problems in multi-phase systems is to focus on ensuring that the clock is very precise and to use very large samplers (referred to herein interchangeably as "latches"). If relatively small latches are used with a very precise clock, sampling errors will still occur due to the fact that the parasitic capacitances of the smaller transistors of the smaller latches result in very significant timing mismatches between the latches. However, if very large latches are used, which means that very large transistors are used to create the latches, the latches are slower and the timing mismatches caused by the differences in the parasitic capacitances of the transistors of the latches are less significant. Therefore, using very large latches with a very precise clock can decrease or eliminate sampling problems caused by phase errors, but there is a tradeoff. As stated above, larger latches take up more area, are slower than smaller latches and also consume more power than smaller latches, which are all undesirable traits in circuit design.

Accordingly, a need exists for a multi-phase system that is capable of sampling high speed signals at the Nyquist rate and that does not require the use of large samplers, which normally have relatively high power consumption requirements. A need also exists for a multi-phase system that does not require that the clock be precise or that the layout for each sampler be completely symmetrical, thus eliminating onerous burdens that would otherwise be placed on designers and manufacturers to create perfectly symmetrical latches and/or perfectly precise clocks.

SUMMARY OF THE INVENTION

In accordance with the present invention, a multi-phase sampling system is provided that utilizes samplers that each sample both a transition and data of the incoming data signal. By allowing each sampler to sample a transition and data of the incoming data signal the multi-phase sampling system is capable of optimizing the sampling tasks performed by the samplers.

In accordance with one embodiment of the present invention, an odd number, n, of samplers are used to sample an incoming data signal. A multi-phase clock generator generates n clock signals of n evenly staggered respective phases. Phase error determination circuitry may then be used to obtain phase errors for each sampler.

If the objective is to correct the phase errors of the apparatus sampling the incoming data signal, such as a receiver, for example, the phase errors are utilized by phase shifting circuitry of the apparatus in a feedback loop to drive the phase errors to zero. In the case where the phase error determination circuitry of the apparatus includes circuitry for determining the phase errors associated with a multi-phase system that is transmitting the data signal, i.e., a transmitter, the phase error determinations made by the apparatus for the transmitter may be sent by the apparatus back to the transmitter to enable the multi-phase transmitter to correct its own phase errors, thereby improving the integrity of the transmitted signal.

This embodiment assumes that the multi-phase transmitter incorporates phase shifting circuitry and feedback loop similar to that incorporated into the multi-phase receiver to enable the multi-phase transmitter to perform the necessary phase error corrections once it receives the phase error determinations. This also assumes that the multi-phase system sampling the received signal have some way of knowing the relative phases of the transmitting multi-phase system, which can be accomplished in a multiplicity of ways, as discussed below in more detail. An alternative to providing the relative phases of the multi-phase transmitter to the multi-phase receiver would be to provide the transmitting multi-phase system with its own phase error determination circuitry in addition to its own phase shifting and feedback circuitry.

In accordance with one embodiment, the apparatus of the present invention is a multi-phase system that comprises at least first, second and third sampling devices, phase error determination circuitry for determining the phase errors associated with each of the samplers of the apparatus and phase shifting circuitry for shifting one or more of the phases in order to drive any phase errors to zero. The associated method includes the steps of sampling a first data signal with first, second and third sampling devices upon receiving first, second and third clock signals of first, second and third phases, respectively, and outputting first, second and third output signals, respectively. Once these steps have been performed, first, second and third phase error determinations associated with the first, second and third output signals are then determined. Then, at least one of the first, second or third phases is shifted in accordance with the respective first, second or third phase error determinations to eliminate or reduce phase errors in the multi-phase system.

In accordance with another embodiment of the present invention, the method and apparatus are implemented in conjunction with a receiver and/or a transmitter and/or a transceiver. In these cases, the phase error determinations of the multi-phase receiver are binned, modulo the number of phases of the multi-phase receiver. Likewise, the phase error determinations of the multi-phase transmitter are binned, modulo the number of phases of the multi-phase transmitter. The phase error determinations corresponding to the receiver are then used by the receiver to drive its own phase errors to zero and the phase error determinations of the transmitter are fed back to the transmitter (or transmitter portion of the transceiver) to inform the transmitter as to how much to adjust its clock phases in order to drive its own phase errors to zero.

In all cases, preferably every sampler samples a transition and data, which enables phase error determinations to be made for every sampler. By allowing phase error determinations to be made for every sampler, the phase error determinations can be used during calibration and in real-time operations to drive the phase errors of the multi-phase system to zero. Therefore, problems that can result from phase errors do not need to be addressed during the design and fabrication stages. Furthermore, the present invention also eliminates the need to use large samplers, which normally have relatively high power consumption requirements, in order to avoid problems associated with phase errors. Also, problems associated with trying to ensure that the multi-phase system clock is extremely precise and/or that the layout for each sampler is completely symmetrical are obviated.

These and other features and embodiments of the present invention will be described below with reference to the detailed description, drawings and claims.

DETAILED DESCRIPTION OF THE INVENTION

The apparatus of the present invention can be implemented by a fully-monolithic technique. Thus, the apparatus and method of the present invention can be implemented in one or more ICs that enable systematic phase errors in a multi-phase system to be reduced or eliminated via precise calibration. However, as will be understood by those skilled in the art from the following description, the present invention applies also to non-monolithic applications and, furthermore, is applicable to any system or application where multiple samplers are needed to sample a signal.

When sampling an analog data voltage signal with a latch (also referred to herein as a sampler) to convert the analog data voltage signal into a digital data voltage signal, there is a precise time at which the latch should sample the signal. The sampling of the analog data voltage signal by the latch is triggered by a clock signal generated by an oscillator. Ideally, the clock signal should arrive at the latch at the precise time that the latch should sample the analog data voltage signal. However, in reality, it is unlikely that the clock signal will arrive at the precise time that the analog data voltage signal should be sampled. This is because, in a multi-phase system, when clock phases are created and routed to latches, errors inherent in the physical structure of the latches and in the oscillator often cause the latches not to be triggered at the precise time necessary to cause the latches to optimally sample the data signal.

Figure 1:
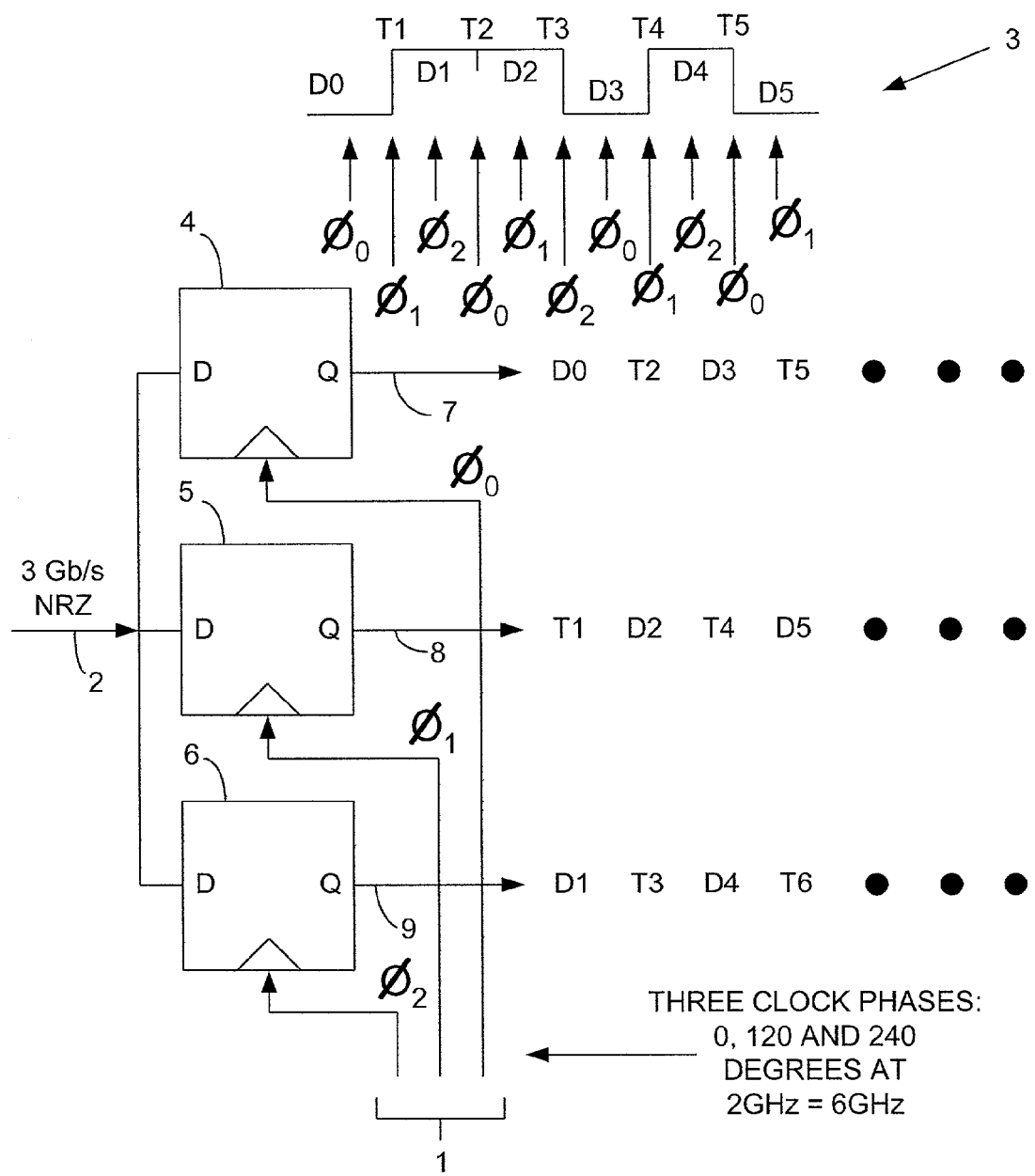
FIG. 1 illustrates a block diagram and associated timing chart for a multi-phase system that uses an odd number of latches to sample a high-speed data stream at the middle and transition points of each bit.

FIG. 1 is an example of a multi-phase system in accordance with the present invention that uses three latches (also referred to herein interchangeably as "samplers") to sample a high-speed data stream at both the middle (Dk) and transition (Tk) of each bit. This differs from known techniques, which employ an even number of samplers. The example system of FIG. 1 utilizes three 2 GHz clock phases, collectively designated by the numeral 1 for sampling an incoming 3 Gb/s data signal designated by the numeral 2, at both the middle of the bit and at the transitions between bits, as shown in the timing diagram 3 of FIG. 1. Each of the three latches 4, 5 and 6 receives one of the three phase-shifted clock signals 1. The timing diagram 3 and the outputs of the latches 4, 5 and 6 indicate the manner in which the high speed input signal 2 is capable of being sampled at the Nyquist rate.

The manner in which the multi-phase system of FIG. 1 operates can be understood by looking at the outputs 7, 8 and 9 of the latches and 4, 5 and 6 at the timing diagram 3. Latch 4 samples at clock phase $\emptyset_0$. Latch 5 samples at clock phase $\emptyset_1$. Latch 6 samples at clock phase $\emptyset_2$. The timing at which each latch samples the middle of a bit or a bit transition is shown in the timing diagram 3. The outputs 7 of latch 4, which samples at clock phase $\emptyset_0$, are mid-bit sample D0, transition bit sample T2, mid-bit sample D3 and transition-bit sample T5, etc. The outputs 8 of latch 5, which samples at clock phase $\emptyset_1$, are transition-bit sample T1, mid-bit sample D2, transition bit sample T4, and mid-bit sample D5, etc. The outputs 9 of latch 6, which samples at clock phase $\emptyset_2$, are mid-bit sample D1, transition bit sample T3, mid-bit sample D4 and transition-bit sample T6, etc. Thus, it can be seen that this multi-phase system samples the data at the Nyquist rate of 6 GHz (i.e., twice the data rate of 3 GHz), and that each sampler samples a transition. By causing each sampler to sample a transition, phase errors can be determined for each of the samplers, as discussed below in more detail.

In accordance with the present invention, it has been determined that the timing of the clock phase signals can be adjusted in accordance with measured sampling timing errors to cause each of the clock phase signals to arrive at the latches at precisely the correct points in time that the latches should be triggered in order to optimally sample the analog data voltage signal and convert it into a digital voltage signal.

Some of the errors for which the multi-phase system should adjust can be mathematically described as follows. Assuming an oscillator "A" having a fundamental oscillation frequency $f_A$, and generating m distinct phases labelled:

$$\Phi_i^A; i \in \{0, 1, 2 \ldots, , , (m-1)\},$$

where each $i^{th}$ phase exhibits a static deterministic phase error $\epsilon_i^A$; $i \in \{0, 1, 2 \ldots, , , (m-1)\}$ with respect to its ideal phase and subject to the constraint that $\Sigma \epsilon_i^A = 0$ due to various circuit mismatches. In addition, because of thermal noise and other random phenomenon, each timing event has an associated additive zero-mean random phase error, which is not correlated between timing events. The present invention eliminates or reduces the deterministic portion of these errors.

The multi-phase clock generation circuit of the present invention, in accordance with an example embodiment, will now be described with reference to Table 1 below and with reference to the block diagram of FIG. 2. Table 1 is a truth table that indicates that logical outputs of multiple latches (e.g., three latches) obtained at a given point in time can be used to determine whether a timing error has occurred. These errors are referred to as "early-late" errors. This truth table is known in the art as an Alexander Phase Determination Truth Table. The early-late error determination technique takes two adjacent bit samples along with an intermediate bit transition sample and logically combines these samples in a known manner to determine whether the phase of the transition is either early or late.

TABLE 1

Truth table for random data early-late ATB phase detector

| Mid Bit Sample (A) | Transition Sample (T) | Mid Bit Sample (B) | Phase Error Determination (ATB Result) |
|---|---|---|---|
| 0 | 0 | 0 | no transition |
| 0 | 0 | 1 | Early |
| 0 | 1 | 0 | Invalid |
| 0 | 1 | 1 | Late |
| 1 | 0 | 0 | Late |
| 1 | 0 | 1 | Invalid |
| 1 | 1 | 0 | Early |
| 1 | 1 | 1 | no transition |

The early-late error results obtained from logically combining the samples are indicated in the last column of Table 1. However, these results provide no guidance as to how much the phase offsets should be adjusted in order to eliminate the errors. In accordance with the present invention, the early-late error determinations are used in a feedback loop to adjust the clock offsets in order to eliminate the errors so that the timing at which the clock signals trigger the latches, or samplers, is correct and precise. In essence, indications of the early-late phase errors are binned into separate charge pumps, modulo the number of phases of the multi-phase system, to enable the clock offsets to be properly and precisely adjusted.

Figure 2:
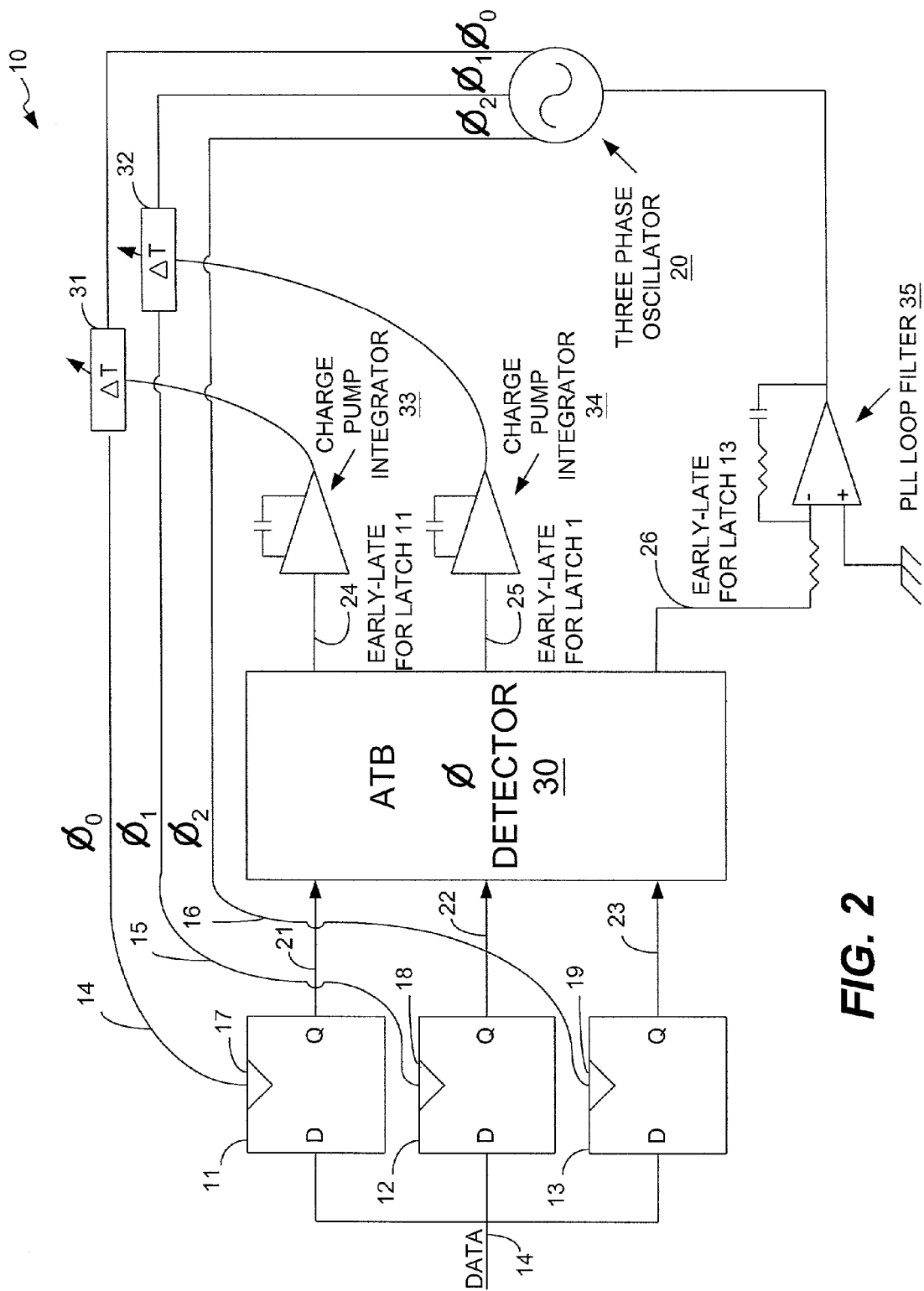
FIG. 2 illustrates a block diagram of the multi-phase clock signal generation circuit of the present invention.

As shown in the example system 10 represented by the block diagram of FIG. 2, three latches 11, 12 and 13 receive the same data signal 14. The latches 11, 12 and 13 are triggered by clock signals 14, 15 and 16, respectively, at clock signal inputs 17, 18 and 19, respectively. The multiphase clock signals 14, 15 and 16 ($\emptyset_0$, $\emptyset_1$ and $\emptyset_2$) are generated by a three-phase oscillator 20. It should be noted that although the system shown in FIG. 2 is a three-phase system, the present invention is not limited to any particular number of phases, or to odd or even phases. The three-phase system 10 of FIG. 2 is being used merely to provide an example of the manner in which the present invention can be implemented.

An ATB detector 30 comprises logic that performs the functions described above with reference to Table 1 to determine whether an early-late error has occurred. The term "ATB" is a short-hand acronym that is generally used in the art to describe the process represented by Table 1, in which the left column is referred to as "A" for the mid-bit A sample, the middle column is referred to as "T" for the transition sample of bit A, and the right column is referred to as "B" for the mid-bit B sample. The ATB detector 30 receives the digital outputs 21, 22 and 23 from latches 11, 12 and 13, respectively, and generates outputs 24, 25 and 26. Outputs 24, 25 and 26 correspond, respectively, to $\emptyset_0$, $\emptyset_1$ and $\emptyset_2$ error samples. In the example shown in FIG. 2, the $\emptyset_2$ error samples are used to phase-lock the system 10 to the data signal, and the $\emptyset_0$ and $\emptyset_1$ error samples are then adjusted via phase shifters 31 and 32, respectively, to be in alignment with $\emptyset_2$. The phase shifters 31 and 32 receive the outputs from charge pump integrators 33 and 34, respectively, which bin the errors for phase shifts $\emptyset_0$ and $\emptyset_1$, respectively. The charge pump integrators 33 and 34 have associated capacitors, as pictorially indicated, and are configured to low pass filter the early-late phase errors and average them (i.e., integrate them) over time.

The charge pump integrators 33 and 34 receive at their inputs the early-late errors in the form of binary signals. If the phase error binary signal received at the input of a charge pump integrator corresponds to an early error indication, a fixed amount of charge is placed on the capacitor associated therewith. If the phase error binary signal received at the input of a charge pump integrator corresponds to a late error indication, a fixed amount of charge is removed from the capacitor associated therewith.

Generally, the example circuit 10 shown in FIG. 2 is calibrated in accordance with the $\emptyset_2$ early-late errors by passing those error signals through a phase-locked loop (PLL) filter 35, which provides feedback to the oscillator 20. The oscillator 20 then generates the three phase clock signals based on the timing of the feedback signal received thereby while maintaining the alignment of the three phase clock signals. Once the circuit 10 has been phase-locked to the $\emptyset_2$ early-late errors, then the phase adjusters 31 and 32 only need to make small phase shifts to $\emptyset_0$ and $\emptyset_1$ to ensure that all three latches are triggered at precisely the correct time. Ideally, the feedback loop in FIG. 2 causes the phase errors to be driven to zero.

It should also be noted that it is not necessary that the apparatus of the present invention can be implemented as a phase-locked system. The apparatus could instead be implemented as a delay-locked system, in which case, for a three-phase system, for example, in which the frequency is known a priori, three phase shifters would be used, rather than two, as shown in the example of FIG. 2. In the delay-locked system, delay elements would be used to determine the phases and then each of the phases would be adjusted by the respective phase shifters, if necessary, in accordance with the respective early-late phase errors. Alternatively, if the frequency is not known, then, in the case of a three-phase system, for example, the sum of all of the early-late error indications would be used to determine the frequency and lock onto it. Subsequently, a three-phase shifter would adjust each of the respective phases in accordance with the early-later error indications. Those skilled in the art will understand, in view of the discussion provided herein, the manner in which such alternate forms of the invention could be implemented.

It can be seen from the example described above with reference to FIG. 2 that separate charge pump integrators are used to bin the error indications, and that the number of charge pumps utilized is based on the modulus (i.e., the number of phases) of the multi-phase system. This binning process is one of the primary features of the present invention because it is what makes precise adjustment of clock offsets possible so that the sampling of the latches (or, in other words, samplers) is precisely performed. This binning process is also referred to herein as modulo binning.

In accordance with another embodiment of the present invention, the method and apparatus are implemented in conjunction with a receiver and/or a transmitter and/or a transceiver. These variations of the present invention will be discussed with reference to FIGS. 3A–3D. In these cases, the phase error indications of the multi-phase system of the receiver can be binned into separate charge pumps, modulo the number of phases of the receiver multi-phase system, in order to enable the receiver clock offsets to be precisely adjusted. Likewise, the phase error indications of the multi-phase system of the transmitter can be binned into separate charge pumps, modulo the number of phases of the transmitter multi-phase system, in order to enable the transmitter clock offsets to be precisely adjusted. The location at which these modulo binning processes are performed is not limited to any particular location. For example, as discussed below in more detail, the receiver can have circuitry such as that shown in FIG. 2 that obtains the phase error indications corresponding to the transmitter multi-phase system and that provides feedback to the transmitter to inform the transmitter as to how much to adjust its clock offsets.

In order to demonstrate the manner in which the present invention can be utilized in these receiver/transmitter/transceiver embodiments, an example will now be described with reference to Tables 2 and 3 in which edges from one n-phase oscillator are used to sample the edges of another m-phase oscillator, where m and n are relatively prime. The phase errors from this cross-sampling are then processed to derive specific phase errors for each of the m+n phases of both the transmitter and receiver oscillators. Once the phase errors have been derived, the binning process of the present invention discussed above with reference to FIG. 2 is used to drive the measured phase errors to zero for all the phases of both oscillators.

For purposes of describing this embodiment, it will be assumed that the receiver (referred to herein as "receiver" or "RX") samples the transmitter (referred to herein as "receiver" or "TX") data at twice the transmitter data bit rate, such that even numbered samples are aligned to the transitions of the TX waveform and odd numbered samples are aligned to the mid-bit of the TX waveform. In accordance with this example embodiment of the present invention, two oscillators, one with m phases, and one with n phases (where m, n are relatively prime) are used to cross sample each other's phase errors. The present invention allows a set of phase errors to be decomposed into errors specific to each of the m and n phases by using the ATB logic and modulo binning process described above with reference to FIG. 2. Feedback loops such as that described above with reference to FIG. 2 are then used to independently drive the m+n error indications to zero by making adjustments to phase shifters in each of the m+n outputs.

Figure 3A:
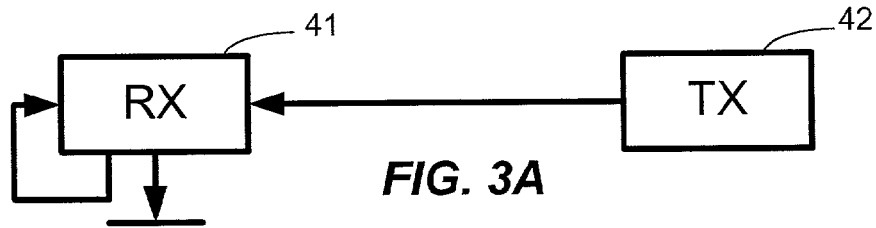
FIGS. 3A–3D are block diagrams illustrating various uses of the present invention in transmitters and/or receivers and/or transceivers.

An example of this embodiment would be a system comprising a transceiver for serial data communication that comprises an m phase oscillator used for the transmitter clock and the n phase oscillator used for the receiver clock. By using the receiver to sample the transmitter output, the phase correction signals can be generated with minimal additional circuitry. In systems such as a multi-phase analog-to-digital converter (ADC), the secondary oscillator is used solely for calibration purposes. In systems where the transmitter phase is not controllable, the receiver preferably is built with an odd number of phases. This is because multi-phase transmitter systems almost universally use $2^k$ phases, $k \in \{1, 2, 3 \ldots\}$, and using an odd number of receiver phases improves the probability that m, n will be relatively prime. A simple case of such a system is shown in FIG. 3A, in which a stand-alone receiver calibrates itself without any communication to the associated transmitter. This would typically be the case of a receiver that is required to be interoperable with industry-standard transmitter parts which may not be capable of calibration, or in a simplex application where there is no means of communication from the receiver, RX, to the transmitter, TX.

If the RX has an oscillator with an odd number of phases, then all phases will eventually be used to sample edges of the incoming data sent from the TX. In this case, odd receiver timing events are used to sample transmitter transitions, which are determined by the transmitter timing events. These phase error indications are preferably low pass filtered in the manner discussed above with reference to FIG. 2, and used in a PLL such as that shown in FIG. 2 to force the mean error between TX edges and RX samples to zero. If m, n are relatively prime, then the deterministic portion of the phase error $E_k$ is periodic with period m*n phase samples, and the average error can be computed by summing over m*n samples by the following equation:

$$\bar{E} = \frac{1}{mn}\sum_{i=0}^{mn-1} E_i = \frac{1}{mn}\sum_{i=0}^{mn-1}\left(\varepsilon^B_{i\bmod n} - \varepsilon^A_{i\bmod m}\right) \quad \text{Equation 1}$$

This can be more intuitively understood by enumerating the phase errors in a simple example. If m=4 and n=3, then the deterministic phase errors will repeat in a cycle of 4*3=12. Table 2 shows the progression.

TABLE 2

| I | TX phase | RX phase |
|---|----------|----------|
| 0 | 0 | 0 |
| 1 | 1 | 1 |
| 2 | 2 | 2 |
| 3 | 3 | 0 |
| 4 | 0 | 1 |
| 5 | 1 | 2 |
| 6 | 2 | 0 |
| 7 | 3 | 1 |
| 8 | 0 | 2 |
| 9 | 1 | 0 |
| 10 | 2 | 1 |
| 11 | 3 | 2 |

By inspection, the rightmost term in Equation 1 can be refactored either as $$\bar{E} = \frac{1}{mn}\sum_{i=0}^{n-1}\left(m\varepsilon^B_i - \sum_{j=0}^{m-1}\varepsilon^A_j\right) \quad \text{Equation 2}$$

corresponding to Table 3 below, or as:

$$\bar{E} = \frac{-1}{mn}\sum_{j=0}^{m-1}\left(n\varepsilon^A_j - \sum_{i=0}^{n-1}\varepsilon^B_i\right) \quad \text{Equation 3}$$

corresponding to Table 4 set forth below Table 3.

TABLE 3

| TX phase | RX phase | Interpretation |
|----------|----------|----------------|
| 0 | 0 | The average of these states |
| 1 | 0 | provides an estimate for error |
| 2 | 0 | in RX phase 0 |

TABLE 3-continued

| TX phase | RX phase | Interpretation |
|----------|----------|----------------|
| 3 | 0 |  |
| 0 | 1 | The average of these states |
| 1 | 1 | provides an estimate for error |
| 2 | 1 | in RX phase 1 |
| 3 | 1 |  |
| 0 | 2 | The average of these states |
| 1 | 2 | provides an estimate for error |
| 2 | 2 | in RX phase 2 |
| 3 | 2 |  |

TABLE 4

| TX phase | RX phase | Interpretation |
|----------|----------|----------------|
| 0 | 0 | The average of these states |
| 0 | 1 | provides an estimate for error |
| 0 | 2 | in TX phase 0 |
| 1 | 0 | The average of these states |
| 1 | 1 | provides an estimate for error |
| 1 | 2 | in TX phase 1 |
| 2 | 0 | The average of these states |
| 2 | 1 | provides an estimate for error |
| 2 | 2 | in TX phase 2 |
| 3 | 0 | The average of these states |
| 3 | 1 | provides an estimate for error |
| 3 | 2 | in TX phase 3 |

The second summation in the parenthesized portions of Equations 2 and 3 are the sum of all the TX and RX phase error terms, respectively. Because the loops are frequency and phased locked, these phase error terms are zero mean and sum to zero over any block of m*n phase samples. Thus, each of the terms of the first summation are equal to each of the n phase errors of the RX and to the m phase errors of the TX. These terms can be easily applied to the phase shifters in the feedback loop to drive the measured phase errors to zero, as will be understood by those skilled in the art in view of the discussion provided herein. Therefore, in accordance with the present invention, the error samples are thereby decimated by either m or n and averaged to produce m+n separate phase error estimates. Each of these estimates will have a mean value proportional to the phase error of each of the TX and RX oscillator phases, respectively.

A short software simulation algorithm that simulates the method of the present invention and that has been coded in the interpreted language AWK (a language named for the initials of its authors) will now be described. The code begins with defining the number of phases for the RX and TX, setting an adaptation coefficient for the feedback loop, setting the number of time steps to be simulated, and initializing a random number generator to generate some number of phase errors:

```
M = 5            # number of phases for RX
N = 4            # number of phases for TX
EPS = 0.003      # adaptation coefficient
MAXTIME = 2000   # number of steps to simulate
srand( );
```

An array is set up to hold the M random phase errors for the RX oscillator, and is initialized to random starting phases. A mean phase error is computed and a correction is subtracted from all the phases to force the mean to zero:

```
# create random phase errors for RX osc
total=0.0
for (i=0; i<M; i++) {
    a[i]=rand( )-0.5
    total+=a[i]
}
for (i=0; i<M; i++) { # force zero mean
    a[i] -= total/M
}
```

The same procedure is followed to initialize the N phase errors for the TX oscillator:

```
# create random phase errors for TX osc
total=0.0
for (i=0; i<N; i++) {
    b[i]=rand( )-0.5
    total+=b[i]
}
for (i=0; i<N; i++) { # force zero mean
    b[i] -= total/N
}
```

In the language AWK, the modulo function is indicated by "%", and so "k mod m" becomes "k%m". The main adaptation loop is then rendered as:

```
for (1=0; i<MAXTIME; i++) {
    aa[i%M] += EPS*sign((a[i%M]-aa[i%M]) -
        (b[i%N]-bb[i%N]))
    bb[i%N] += EPS*sign((b[i%N]-bb[i%N]) -
        (a[i%M]-aa[i%M]))
    print i, a[i%M]-aa[i%M], "a" i%M
    print i, b[i%N]-bb[i%N], "b" i%N
}
```

The values stored in the arrays "aa[i%M]" and "bb[i%N]" are updated in the code steps of EPS and are used to develop estimates of the phase error for each oscillator phase. In practice, these values would be used to drive phase shifter circuits (e.g., elements 31 and 32 in FIG. 2) for each oscillator output in order to drive the phase errors to zero. In the above code example, the update for each phase estimate may be computed by:

EPS*sign((a[i%M]-aa[i%M])-(b[i%N]-bb[i%N]))

This line of code can be viewed as corresponding to the scaled binary difference between the corrected RX and TX phase errors. The sign( ) function simply returns 1 or −1, depending on the sign of the phase error. This is used as follows to simulate a binary quantized phase error consistent with the algorithm of Table 1.

```
# implement 1st order BB control
# return only the sign of error
function sign(a) {
    if (a>0) {
        return 1
    } else {
        return -1
    }
}
```

In order to simulate the situation in which the remote transmitter is not capable of being calibrated by information gathered at the receiver, the TX adaptation is inhibited by commenting out the line of code:

```
# aa[i%M] += EPS*sign((a[i%M]-aa[i%M]) -
    (b[i%N]-bb[i%N]))
```

FIG. 3A is an example embodiment of one possible implementation of the present invention in which a stand-alone receiver, RX 41, calibrates itself without providing any communication back to the remote transmitter, TX 42. As stated above, this implementation would be useful for a receiver that is required to be interoperable with industry-standard transmitter parts that may not be capable of calibration in accordance with the present invention, or in a simplex application where there is no mechanism for providing communication from RX 41 to TX 42. If the RX 41 has an oscillator with an odd number of phases, then all phases will eventually be used to sample edges of the incoming data from TX 42. Odd receiver timing events are used to sample transmitter transitions, which are determined by the transmitter timing events.

Figure 3B:
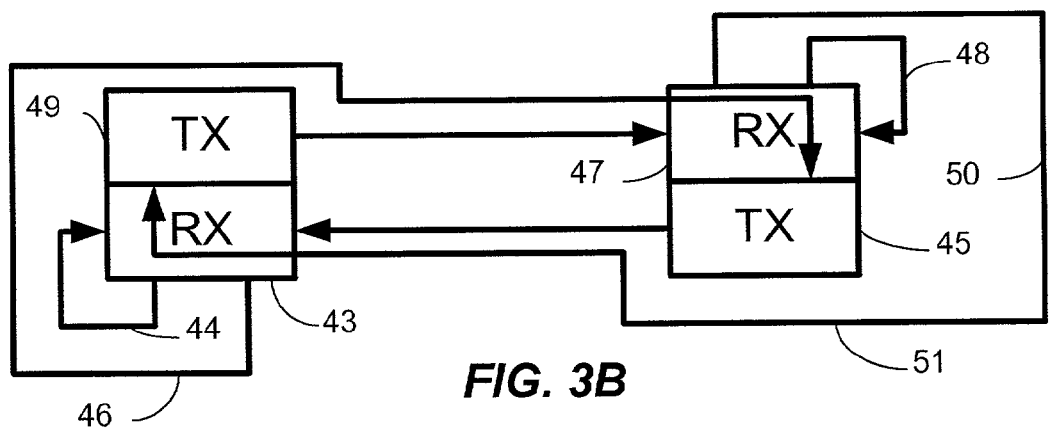

FIG. 3B shows an enhancement of the configuration shown in FIG. 3A in which periodic calibration data is transmitted from the local RX 43 back to itself, as indicated by arrow 44, and to remote TX 45, as indicated by arrow 46. Likewise, periodic calibration data is transmitted from remote RX 47 back to itself, as indicated by arrow 48, and to remote TX 49, as indicated by arrow 51. Such a system could be implemented for a proprietary full-duplex link, or for a full-duplex link in which a standard is adopted to provide for the flow of low bandwidth calibration data from an RX to a remote TX.

Figure 3C:
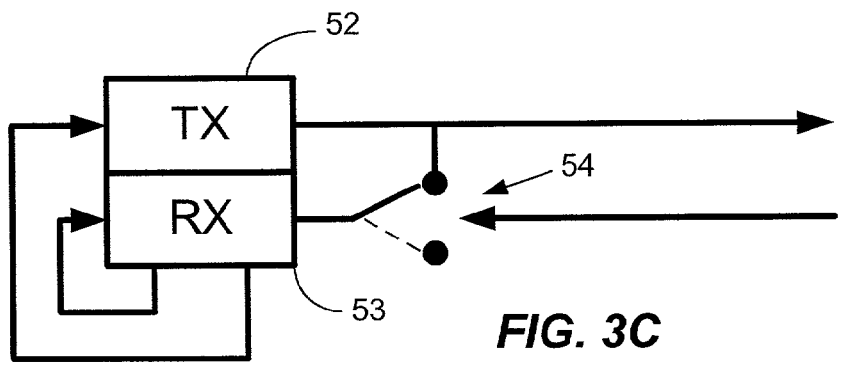

FIG. 3C shows a system embodiment in which a transceiver IC chip is architected to have a both transmitter, TX 52, and a receiver, RX 53. During power up, a switch 54 on the RX 53 input is switched to the calibration position connecting the RX 53 input to the TX 52 output. The RX 53 then generates calibration values for both the TX 52 and RX 53 oscillators. Once the calibration has converged, the values are frozen and stored in local memory (not shown). This approach has the advantage of correcting deterministic phase errors in both the RX 53 and the TX 52. In this system, it is still possible to actively calibrate the RX 53, even after power up, in the manner discussed above with reference to FIGS. 3A and 3B.

Figure 3D:
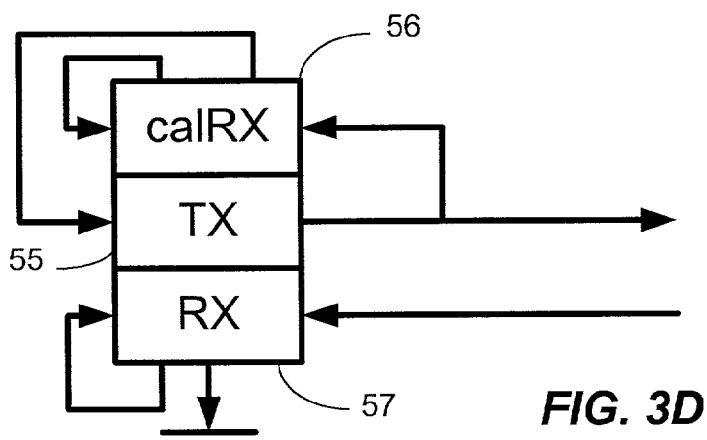

In FIG. 3D, a system is shown in which the TX 55 has a duplicate receiver (calRX) 56 comprised of a third oscillator and sampling structure which is used to continuously calibrate the TX 55 and calRX 56. The receiver RX 57 calibrates itself. This system has good flexibility in that it requires no support in the communication channel for transmitting calibration information over a link, as is the case with the transceiver 52/receiver pair 53 shown in FIG. 3C. Furthermore, the system shown in FIG. 3D operates continuously (i.e., continuously calibrates), and is compatible with equipment installed at the remote end that does not use calibration in accordance with the present invention. Of course a possible disadvantage of the system of FIG. 3D is that it requires more hardware than the systems shown in FIGS. 3A–3C.

In the embodiments of FIGS. 3B, 3C, and 3D, the RXs must somehow communicate the m calibration terms back to the TX phase shifter circuitry. To accomplish this, the RX preferably unambiguously labels the m indications so that the TX can apply the corrections to the proper phases. In accordance with the present invention, two general mechanisms are proposed for this purpose, although the present invention is not limited to these mechanisms. In systems that calibrate a local TX, such as in the systems demonstrated by FIGS. 3C and 3D, once the RX is locked to the TX, it is possible for the RX circuitry to access the state of the TX phases directly. A phase-slip detector can be used to monitor the RX and TX phase alignment to ensure that no information is transferred until the clocks are stable.

In systems where a remote TX is calibrated, such as in the system demonstrated by FIG. 3B, the RX may derive the phase labeling from some characteristic of the data stream. For example, in the art of data coding, the manner in which a stationary, unique marker can be embedded in a data sequence is well known. This can be accomplished with, for example, training sequences, sync characters, and master transitions. The TX can either send such markers aligned to a known phase, or, alternatively, send a marker in conjunction with a label that designates the phase of the marker. Upon receipt of such a marker, the RX would either set its local modulo m counter to the agreed upon phase or to the value given in the label. By this mechanism, the RX is able to uniquely indicate to the TX the phase to which each correction signal applies.

It should be noted that the present invention has been described with reference to example embodiments, and that the present invention is not limited to the embodiments described herein. Those skilled in the art will understand, in view of the discussion provided herein, that modifications can be made to the embodiments described above without deviating from the scope of the present invention. For example, although the circuit 10 shown in FIG. 2 has been described as comprising certain components, those skilled in the art will understand that different components can be used to implement such a circuit. Also, the circuit 10 can be embedded in a single IC or implemented using discrete components. Also, the circuit 10 can be implemented solely in hardware (e.g., with gates in an IC), or as a combination of hardware and software, as will be understood by those skilled in the art. For example, the ATB Detector 30 may be implemented in software that performs the Alexander Truth Table algorithm, whereas the other components may be implemented in hardware either as components with an IC or as discrete components.

What is claimed is:

1. A multi-phase sampling system having an odd number of evenly distributed clock phases, the clock phases being generated by a multi-phase clock generator, the multi-phase sampling system comprising:

a plurality of samplers, each of the samplers sampling a same input data signal when a clock signal of one of the respective phases is received by the respective sampler, each sampler sampling a portion of the input data signal corresponding to a transition of the input data signal and a portion of the input data signal corresponding to data, the portion of the input data signal corresponding to data being in between two consecutive transitions of the input data signal, each sampler outputting a respective output signal; and phase error determination circuitry, the phase error determination circuitry receiving the respective output signals and making a respective phase error determination based on each of the respective output signals, wherein the multi-phase sampling system is part of a receiver that is in communication with a multi-phase system of a transmitter and wherein some of the phase error determinations correspond to phase errors of the multi-phase system of the receiver and wherein some of the phase error determinations correspond to phase errors of the multi-phase system of the transmitter.

2. The multi-phase system of claim 1, wherein the multi-phase system comprises an odd number of said samplers.

3. The multi-phase system of claim 1, further comprising:
circuitry configured to shift one or more of the phases in accordance with the respective phase error determinations.

4. The multi-phase system of claim 3, wherein the phase error determinations that correspond to phase errors of the multi-phase system of the transmitter are fed back to the multi-phase system of the transmitter to enable phase shifting circuitry of the multi-phase system of the transmitter to shift one or more of the phases of the multi-phase system of the transmitter in accordance with the respective phase error determinations of the multi-phase system of the transmitter.

5. A multi-phase system comprising a multi-phase clock signal generator that generates at least a first clock signal having a first phase, a second clock signal having a second phase, and a third clock signal having a third phase, the first, second and third phases being different from each other, the system comprising:

a first sampling device that receives a first data signal and the first clock signal, the first sampling device comprising first sampling logic configured to sample the first data signal when the first clock signal is received by the first sampling device and to cause a first output signal to be output from the first sampling device, the first sampling device sampling the first data signal at a portion of the first data signal corresponding to a transition of the first data signal and at a portion of the first data signal corresponding to data, the portion of the first data signal corresponding to data being in between two consecutive transitions of the first data signal;

a second sampling device that receives the first data signal and the second clock signal, the second sampling device comprising second sampling logic configured to sample the first data signal when the second clock signal is received by the second sampling device and to cause a second output signal to be output from the second sampling device, the second sampling device sampling the first data signal at a portion of the first data signal corresponding to a transition of the first data signal and at a portion of the first data signal corresponding to data, the portion of the first data signal corresponding to data being in between two consecutive transitions of the first data signal;

a third sampling device that receives the first data signal and the third clock signal, the third sampling device comprising third sampling logic configured to sample the first data signal when the third clock signal is received by the third sampling device and to cause a third output signal to be output from the third sampling device, the third sampling device sampling the first data signal at a portion of the first data signal corresponding to a transition of the first data signal and at a portion of the first data signal corresponding to data, the portion of the first data signal corresponding to data being in between two consecutive transitions of the first data signal;

phase error determination circuitry configured to determine a first phase error indication associated with the first output signal, a second phase error indication associated with the second output signal and a third phase error indication associated with the third output signal; and circuitry configured to shift at least one of the first, second or third phases in accordance with the respective first, second, or third phase error indications, wherein at least the first phase error indication is used by said circuitry configured to shift at least one of the first, second or third phases to phase-lock the multi-phase clock signal generator, and wherein said circuitry configured to shift at least one of the first, second or third phases shifts at least the second and third phases in accordance with the second and third phase error indications, respectively.

6. The system of claim 5, wherein the first, second and third phase error indications are used by said circuitry configured to shift at least one of the first, second, or third phases to phase-lock the multi-phase clock signal generator, and wherein said circuitry configured to shift at least one of the first, second or third phases shifts the first, second and third phases in accordance with the first, second and third phase error indications, respectively.

7. The system of claim 5, wherein said circuitry configured to shift at least one of the first, second, or third phases includes first, second and third charge pumps that perform modulo binning of the first, second and third phase error indications, respectively, to obtain first, second and third phase shifting values, and wherein said circuitry is configured to shift at least one of the first, second, or third phases in accordance with the obtained first, second and third phase shifting values, respectively.

8. The system of claim 5, wherein the phase error determination circuitry comprises logic that is configured based on an Alexander Phase Determination Truth Table algorithm.

9. The system of claim 7, wherein said circuitry configured to shift at least one of the first, second, or third phases further includes at least first and second phase shifters configured to operate on the first and second clock signals, respectively, the first and second phase shifters receiving outputs from the first and second charge pumps, respectively, the first and second phase shifters shifting the first and second phases, respectively, in accordance with the outputs received from the first and second charge pumps, respectively.

10. The system of claim 9, wherein the system is incorporated into a receiver, and wherein the phase shifts cause the first and second clock signals to arrive at the first and second sampling devices, respectively, at particular points in time to thereby cause the first and second sampling devices to sample the first data signal at correct points in time, the first data signal corresponding to a signal transmitted by a transmitter.

11. The system of claim 9, wherein the system is part of a receiver, and wherein the phase shifts cause the first and second clock signals to arrive at the first and second sampling devices, respectively, at particular points in time to cause the first and second sampling logic to optimally sample the first data signal, the first data signal corresponding to a signal transmitted by a transmitter, the transmitter being a multi-phase system comprising a multi-phase clock generator that generates at least third, fourth, fifth, sixth and seventh clock signals having third, fourth, fifth, sixth and seventh phases, respectively, the third, fourth, fifth, sixth and seventh phases being different from each other, and wherein the phase error determination circuitry is also configured to determine one or more phase error indications associated with events occurring in the transmitter, and wherein the phase error indications determined to be associated with events occurring in the transmitter are transmitted by the receiver to the transmitter to enable the transmitter to adjust the third, fourth, fifth, sixth and seventh phases to eliminate phase errors in the third, fourth, fifth, sixth and seventh clock signals.

12. The system of claim 9, wherein the system is part of a transceiver, the transceiver comprising a local receiver and a local transmitter, and wherein the phase shifts cause the first and second clock signals to arrive at the first and second sampling devices, respectively, at particular points to cause the first and second sampling logic to optimally sample the first data signal, and wherein the first data signal corresponds to a signal transmitted by a remote transmitter, the remote transmitter being a multi-phase system comprising a multi-phase clock generator that generates at least third, fourth, fifth, sixth and seventh clock signals having third, fourth, fifth, sixth and seventh phases, respectively, the third, fourth, fifth, sixth and seventh phases being different from each other, and wherein the phase error determination circuitry is also configured to determine one or more phase error indications associated with events occurring in the remote transmitter, and wherein the phase error indications determined to be associated with events occurring in the remote transmitter are transmitted by the receiver to the remote transmitter to enable the remote transmitter to adjust the third, fourth, fifth, sixth and seventh phases to eliminate phase errors in the third, fourth, fifth, sixth and seventh clock signals, respectively.

13. An apparatus for sampling signals in a first multi-phase system, the first multi-phase system comprising a multi-phase clock signal generator that generates m clock phases for m clock signals, each clock phase being different, the apparatus comprising:

n sampling devices, m and n being integers that are relatively prime, wherein n corresponds to a number of clock phases of a second multi-phase system and is equal to or greater than 3, each of the sampling devices sampling a first data signal when one of the m clock signals is received by the sampling device and outputting an output signal;

phase error determination circuitry, the phase error determination circuitry being configured to determine a phase error indication associated with each output of the n sampling devices;

m+n modulo binning devices, and wherein m of the modulo binning devices perform binning of the phase error indications associated with the outputs of the n sampling devices to obtain phase error adjustment values for the m clock phases, and wherein n of the modulo binning devices perform modulo binning of the phase error indications associated with the outputs of the n sampling devices to obtain phase error adjustment values for the n clock phases; and phase shifting circuitry of the first multi-phase system configured to shift the m clock phases in accordance with the phase error adjustment values obtained for the m clock phases.

14. The apparatus of claim 13, wherein the first multi-phase system is a receiver and wherein the second multi-phase system is a transmitter, and wherein m is an odd number that is equal to or greater than 3.

15. The apparatus of claim 13, wherein the first multi-phase system is a receiver that includes routing logic configured to cause the phase error adjustment values obtained for the n clock phases to be sent to said second multi-phase system, the second multi-phase system corresponding to a remote transmitter, and wherein the first data signal sampled by said n sampling devices corresponds to a signal transmitted by the remote transmitter.

16. The apparatus of claim 13, wherein the first multi-phase system is a local receiver of a transceiver, the transceiver comprising the local receiver and a local transmitter, the second multi-phase system corresponding to said local transmitter, the transceiver including routing logic configured to cause the phase error adjustment values obtained for the n clock phases to be sent to said second multi-phase system, and wherein the first data signal sampled by said n sampling devices corresponds to a signal transmitted by the local transmitter.

17. An apparatus for controlling sampling operations in a first multi-phase system and in a second multi-phase system, the first multi-phase system comprising a first multi-phase clock signal generator that generates m clock signals of m different phases, the second multi-phase system comprising a second multi-phase clock signal generator that generates n clock signals of n different phases, m and n being integers that are relatively prime, the apparatus comprising:
  n sampling devices of the first multi-phase system, each of the sampling devices sampling a data signal of the second multi-phase system when one of the m clock signals is received by the sampling device and outputting an output signal, and wherein n is equal to or greater than 3;
  phase error determination circuitry of the first multi-phase system, the phase error determination circuitry being configured to determine a phase error indication associated with each output of the sampling devices;
  m+n modulo binning devices, wherein m of the modulo binning devices perform binning of the phase error indications associated with the outputs of the n sampling devices to obtain phase error adjustment values for the m clock phases, and wherein n of the modulo binning devices perform modulo binning of the phase error indications associated with the outputs of the n sampling devices to obtain phase error adjustment values for the n clock phases; and
  phase shifting circuitry of the first multi-phase system configured to shift the m clock phases in accordance with the phase error adjustment values obtained for the m clock phases; and
  phase shifting circuitry of the second multi-phase system configured to shift the n clock phases in accordance with the phase error adjustment values obtained for the n clock phases.

18. The apparatus of claim 17, wherein the first multi-phase system is a local receiver and the second multi-phase system is a remote transmitter, the apparatus being included in the first multi-phase system, and wherein the apparatus further comprises routing logic configured to cause the phase error adjustment values obtained for the n clock phases to be sent to said second multi-phase system.

19. The apparatus of claim 17, wherein the first multi-phase system is a local receiver of a transceiver, the transceiver comprising the local receiver and a local transmitter, the second multi-phase system corresponding to the local transmitter, the transceiver including routing logic configured to cause the phase error adjustment values obtained for the n clock phases to be sent to said local transmitter to be used by the phase shifting circuitry of the local transmitter to shift the n clock phases in accordance with the phase error adjustment values obtained for the n clock phases.

20. The apparatus of claim 17, wherein the phase error determination circuitry comprises logic that determines phase errors based on an Alexander Phase Determination Truth Table algorithm.

21. The apparatus of claim 17, wherein the modulo binning of the phase error indications is performed by delivering the phase error indications to respective charge pumps of the modulo binning devices in a round robin fashion.

22. A method for sampling signals in a first multi-phase system, the first multi-phase system comprising a multi-phase clock signal generator that generates m clock phases, each clock phase being different, the method comprising the steps of:
  sampling a first data signal with n sampling devices, wherein n corresponds to a number of clock phases of a second multi-phase system and wherein m and n are integers that are relatively prime and n is equal to or greater than 3, each sampling device sampling the first data signal when one of the m clock signals is received by the respective sampling device and outputting an output signal;
  determining a phase error indication associated with each output of the n sampling devices;
  utilizing m+n modulo binning devices to perform binning of the phase error indications associated with the outputs of the sampling devices to obtain phase error adjustment values for the m clock phases and phase error adjustment values for the n clock phases; and
  shifting the m clock phases in accordance with the phase error adjustment values obtained for the m clock phases.

23. The method of claim 22, wherein the first multi-phase system is a receiver that includes routing logic configured to cause the phase error adjustment values obtained for the n clock phases to be sent to said second multi-phase system, the second multi-phase system corresponding to a remote transmitter, and wherein the first data signal sampled by said n sampling devices corresponds to a signal transmitted by the remote transmitter.

24. The method of claim 22, wherein the first multi-phase system is a local receiver of a transceiver, the transceiver comprising the local receiver and a local transmitter, the transceiver including routing logic configured to cause the phase error adjustment values obtained for the n clock phases to be sent to said second multi-phase system, the second multi-phase system corresponding to said local transmitter, and wherein the first data signal sampled by said n sampling devices corresponds to a signal transmitted by the local transmitter.

25. A method for controlling sampling operations in a first multi-phase system and in a second multi-phase system, the first multi-phase system comprising a first multi-phase clock signal generator that generates m clock phases, each clock phase being different, the second multi-phase system comprising a second multi-phase clock signal generator that generates n clock phases, each of the n clock phases being different, m and n being integers that are relatively prime, the method comprising the steps of:
  sampling a data signal n sampling devices, each of the n sampling devices sampling the data signal upon receiving one of the m clock signals and outputting an associated output signal, and wherein n is equal to or greater than 3;
  for each output signal, determining a corresponding phase error indication;

binning the phase error indications modulo m to obtain phase error adjustment values for the m clock phases;

binning the phase error indications modulo n and to obtain phase error adjustment values for the n clock phases; and shifting the m clock phases in accordance with the phase error adjustment values obtained for the m clock phases; and shifting the n clock phases in accordance with the phase error adjustment values obtained for the n clock phases.

26. A method for controlling clock phases in a multi-phase system, the multi-phase system comprising a multi-phase clock signal generator that generates at least a first clock signal having a first phase, a second clock signal having a second phase, and a third clock signal having a third phase, the first, second and third phases being different from each other, the method comprising the steps of:

sampling a first data signal with a first sampling device when the first clock signal is received by the first sampling device and outputting a first output signal from the first sampling device, the first sampling device sampling the first data signal at a portion of the first data signal corresponding to a transition of the first data signal and at a portion of the first data signal corresponding to data, the portion of the first data signal corresponding to data being in between two consecutive transitions of the first data signal;

sampling the first data signal with a second sampling device when the first clock signal is received by the second sampling device and outputting a second output signal from the second sampling device, the second sampling device sampling the first data signal at a portion of the first data signal corresponding to a transition of the first data signal and at a portion of the first data signal corresponding to data, the portion of the first data signal corresponding to data being in between two consecutive transitions of the first data signal;

sampling the first data signal with a third sampling device when the first clock signal is received by the third sampling device and outputting a third output signal from the third sampling device, the third sampling device sampling the first data signal at a portion of the first data signal corresponding to a transition of the first data signal and at a portion of the first data signal corresponding to data, the portion of the first data signal corresponding to data being in between two consecutive transitions of the first data signal;

determining at least a first phase error indication associated with the first output signal, a second phase error indication associated with the second output signal and a third phase error indication associated with the third output signal;

shifting at least one of the first, second or third phases in accordance with the respective first, second or third phase error indications; and phase-locking the multi-phase clock signal generator in accordance with the first phase error indication.

27. The method of claim 26, wherein the step of shifting the first and second phases includes utilizing at least first and second charge pumps to perform modulo binning of the first and second phase error indications, respectively, to obtain first and second phase shifting values and shifting the first and second phases in accordance with the obtained first and second phase shift values, respectively.

28. The method of claim 26, wherein the phase errors are determined based on an Alexander Phase Determination Truth Table algorithm.

* * * * *